(12) United States Patent
Liu et al.

(10) Patent No.: US 6,440,861 B1
(45) Date of Patent: Aug. 27, 2002

(54) METHOD OF FORMING DUAL DAMASCENE STRUCTURE

(75) Inventors: Chih-Chien Liu; Jui-Tsen Huang, both of Taipei; Yi-Fang Cheng, Yunglin Hsien; Ming-Sheng Yang, Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/652,471

(22) Filed: Aug. 31, 2000

(30) Foreign Application Priority Data

Aug. 17, 2000 (TW) ........................................ 89116603 A

(51) Int. Cl.[7] ............................................. H01L 21/302
(52) U.S. Cl. ..................... 438/706; 438/723; 438/724; 438/694; 438/689; 438/660; 438/672
(58) Field of Search .................................. 438/633, 706, 438/694, 687, 723, 724, 689, 660, 624, 637, 639, 666, 672

(56) References Cited

U.S. PATENT DOCUMENTS 6,040,243 A * 3/2000 Li et al. ...................... 438/687
6,268,291 B1 * 7/2001 Andricacos et al. ........ 438/694
6,268,294 B1 * 7/2001 Jang et al. ................... 438/706
6,271,593 B1 * 8/2001 Givens et al. ............... 257/752

FOREIGN PATENT DOCUMENTS

JP            2000208745 A   *  7/2000   ......... H01L/27/108

* cited by examiner

Primary Examiner—Caridad Everhart
Assistant Examiner—V. Yevsikov
(74) Attorney, Agent, or Firm—J.C. Patents

(57) ABSTRACT

A method of forming a dual damascene structure. A first dielectric layer and a second dielectric layer are sequentially formed over a substrate. A first photoresist layer is formed over the second dielectric layer. Photolithographic and etching operations are conducted to remove a portion of the second dielectric layer and the first dielectric layer so that a via opening is formed. A conformal third dielectric layer is coated over the surface of the second dielectric layer and the interior surface of the via opening. The conformal third dielectric layer forms a liner dielectric layer. A second photoresist layer is formed over the second dielectric layer and then the second photoresist layer is patterned. Using the patterned second photoresist layer as a mask, a portion of the second dielectric layer is removed to form a trench. The patterned second photoresist layer is removed. Conductive material is deposited over the substrate to fill the via opening and the trench. Finally, chemical-mechanical polishing is conducted to remove excess conductive material above the second dielectric layer.

15 Claims, 5 Drawing Sheets

METHOD OF FORMING DUAL DAMASCENE STRUCTURE

CROSS-REFERENCE TO RELATED APPLICATION

This application claims the priority benefit of Taiwan application Ser. No. 89116603, filed Aug. 17, 2000.

BACKGROUND OF THE INVENTION

1. Field of Invention

The present invention relates to a method of forming a dual damascene structure. More particularly, the present invention relates to a method of forming a dual damascene opening capable of reducing the degree of interaction between low dielectric constant material and photoresist material.

2. Description of Related Art

The operating speed is often a principle consideration by customer to choose a particular brand of semiconductor products by customers. At present, major factors that may affect the operating speed of a device include the resistivity of conducting wires and parasitic capacitor of the inter-layer dielectric layer. To reduce wire resistance, low resistance metallic material is often used to form the conducting wires. To improve inter-layer parasitic capacitance, material having a low dielectric constant is frequently employed to form the insulation layer between metallic interconnects.

In general, conventional metallic interconnects are fabricated by forming a metal plug in a dielectric layer followed by depositing aluminum material over the metal plug to form an aluminum wire. Dual damascene technique is a low-cost, high-reliability method of fabricating the metallic lines of an integrated circuit. Moreover, the metallic material for forming the metallic interconnects in a dual damascene structure can be etched without much restriction. Hence, dual damascene techniques are frequently used to form low resistance copper wires for increasing the operating speed of circuit devices. As the level of integration of devices continues to increase, the use of low dielectric constant material to fabricate dual damascene structures is fast becoming a standard in the semiconductor industry.

FIGS. 1A through 1D are schematic cross-sectional views showing the progression of steps for fabricating a conventional dual damascene structure. As shown in FIG. 1A, a substrate 100 having a metallic layer 102 therein is provided. A dielectric layer 104, an etching stop layer 106 and a dielectric layer 108 are sequentially formed over the substrate 100. A photoresist layer 110 is next formed over the dielectric layer 108. Conventional photolithographic technique is applied to pattern the photoresist layer 110 so that location of a via opening is defined.

As shown in FIG. 1B, using the photoresist layer 110 as an etching mask, the dielectric layer 108, the etching stop layer 106 and the dielectric layer 104 are sequentially etched to form a via opening 112 that exposes the metallic layer 102. The photoresist layer 110 is removed and then another photoresist layer 114 is formed over the substrate 100. Conventional photolithographic technique is again applied to pattern the photoresist layer 114 so that location of a trench is defined.

As shown in FIG. 1C, using the photoresist layer 114 as an etching mask and the etching stop layer 106 as an etching stop, the dielectric layer 108 is etched to form a trench 116. In the subsequent step, the photoresist layer 114 is removed and then metal is deposited into the trench 116 and the via opening 112 to form a metallic layer 118. Ultimately, a dual damascene structure having a cross-sectional profile as shown in FIG. 1D is formed.

As the level of integration continues to increase, parasitic capacitance that results from the inter-metal dielectric layer will be intensified. In particular, low dielectric constant material is frequently employed to form the inter-metal dielectric layer in the manufacturing of deep sub-micron devices so that effects due to resistance-capacitance time delay is reduced. However, common photoresist material is composed of high molecular weight substances and most high dielectric constant material is composed of organic high molecular weight compounds. Consequently, in the photolithographic patterning of the photoresist layers 110 and 114, organic low dielectric constant material may react chemically with the photoresist material. The resultant products of the reactions may adhere to the surface of a dual damascene contact to form a residue that is impossible to remove in a subsequent cleaning operation. Furthermore, before the dielectric layer 108 is etched to form the trench 116, photoresist material is often deposited into the via opening 112 to serve as a hard mask so that the metallic layer 102 is protected. This photoresist material often reacts with nearby low dielectric constant material to form a residue. The residue damages the ideal profile of a dual damascene structure and affects the uniformity of subsequently formed copper seeding layer. A non-linear copper seeding layer often result in the formation of low-quality copper lines.

SUMMARY OF THE INVENTION

Accordingly, one object of the present invention is to provide a method of forming a dual damascene structure capable of lowering parasitic effect by using low dielectric constant material so that highly integrated device circuits are formed. In addition, the method is capable of preventing any chemical reaction between photoresist and dielectric material to form difficult-to-remove residues on the sidewalls of via openings. Hence, an ideal profile of the dual damascene structure can be preserved.

A second object of this invention is to provide a method of forming a dual damascene structure that does not require the formation of an etching barrier layer. Instead, differences in etching rates between two low dielectric constant dielectric layer is utilized to form the opening of the dual damascene structure so that processing steps are saved.

To achieve these and other advantages and in accordance with the purpose of the invention, as embodied and broadly described herein, the invention provides a method of forming a dual damascene structure. A first dielectric layer and a second dielectric layer are sequentially formed over a substrate. A first photoresist layer is formed over the second dielectric layer. Photolithographic and etching operations are conducted to remove a portion of the second dielectric layer and the first dielectric layer so that a via opening is formed. A conformal third dielectric layer is coated over the surface of the second dielectric layer and the interior surface of the via opening. The conformal third dielectric layer forms a liner dielectric layer. A second photoresist layer is formed over the second dielectric layer and then the second photoresist layer is patterned. Using the patterned second photoresist layer as a mask, a portion of the second dielectric layer is removed to form a trench. The patterned second photoresist layer is removed. Conductive material is deposited over the substrate to fill the via opening and the trench. Finally, chemical-mechanical polishing is conducted to remove excess conductive material above the second dielectric layer. If the conductive material is copper, a copper seeding layer needs to form on the surface of the second dielectric layer, the via opening and the trench before the deposition of copper.

Since the surface of the second dielectric layer is not protected by any layer when the first photoresist layer is deposited, difficult-to-remove residues will form on the surface of the second dielectric layer. Hence, a non-uniform copper seeding layer is formed on the interface with the second dielectric layer. On the other hand, the sidewalls and bottom of both the via opening and trench are protected by the liner dielectric layer. Thus, an ideal profile is preserved and subsequent copper deposition is facilitated. However, any non-uniformity in the copper layer is finally removed by the planarization of the copper layer through chemical-mechanical polishing.

In the embodiment of this invention, the liner dielectric layers serve as a partition that separates the photoresist material from the low dielectric constant material during photoresist coating and developing steps. Consequently, the low dielectric constant first and second dielectric layers are prevented from reacting with photoresist material and the intended dual damascene profile is preserved. The liner dielectric layer can be a silicon oxide layer formed by low-pressure chemical vapor deposition.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
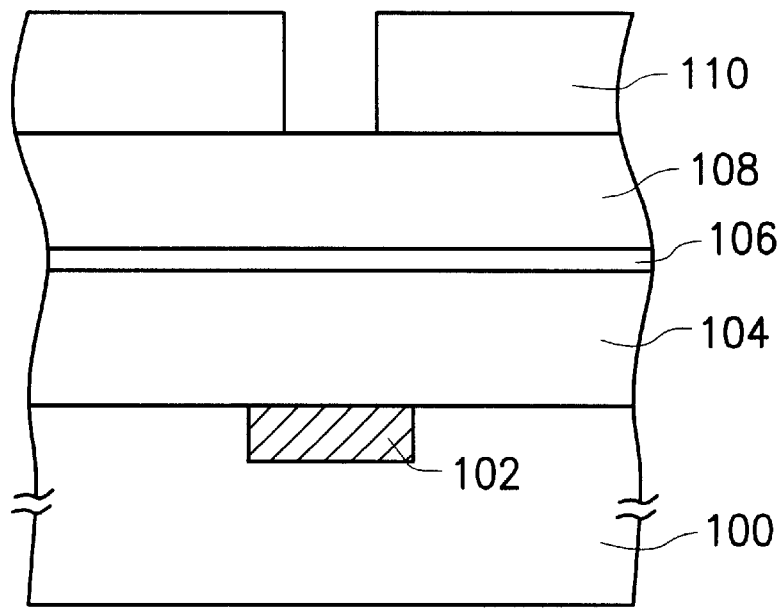
FIGS. 1A through 1D are schematic cross-sectional views showing the progression of steps for fabricating a conventional dual damascene structure.
Figure 1B:
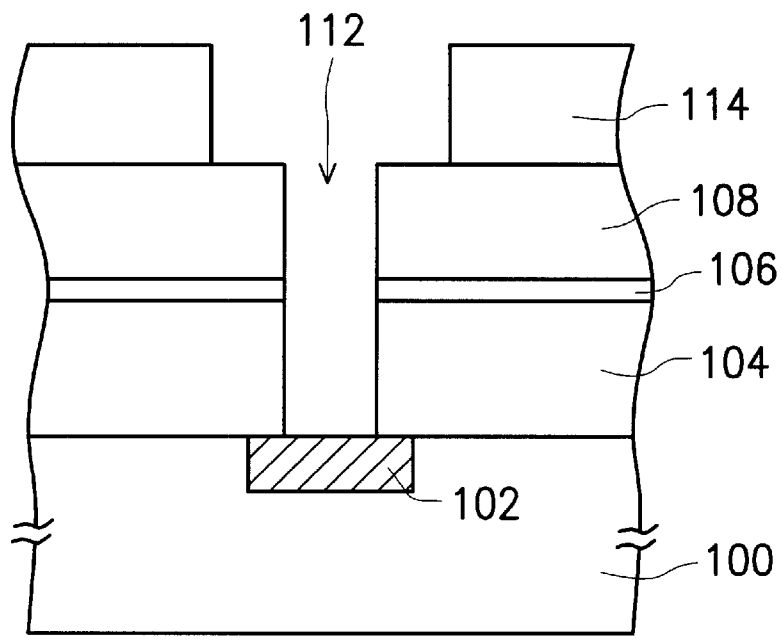
Figure 1C:
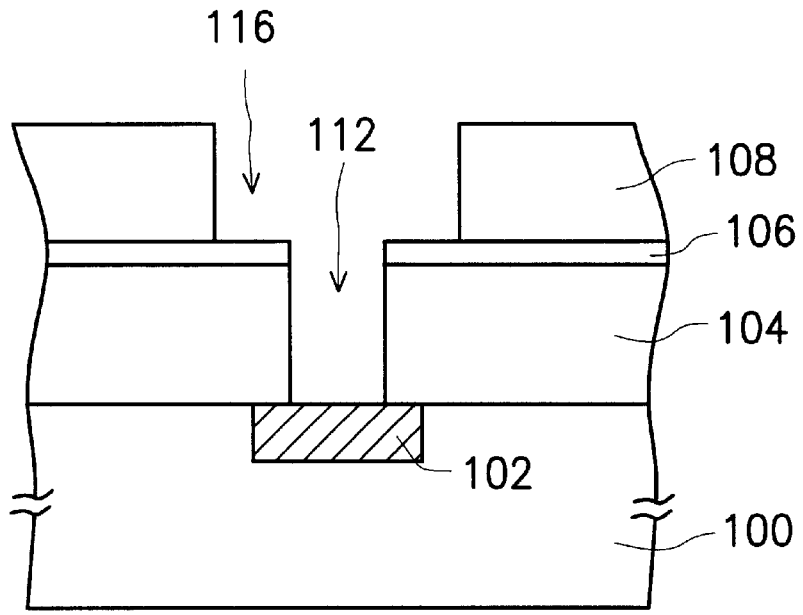
Figure 1D:
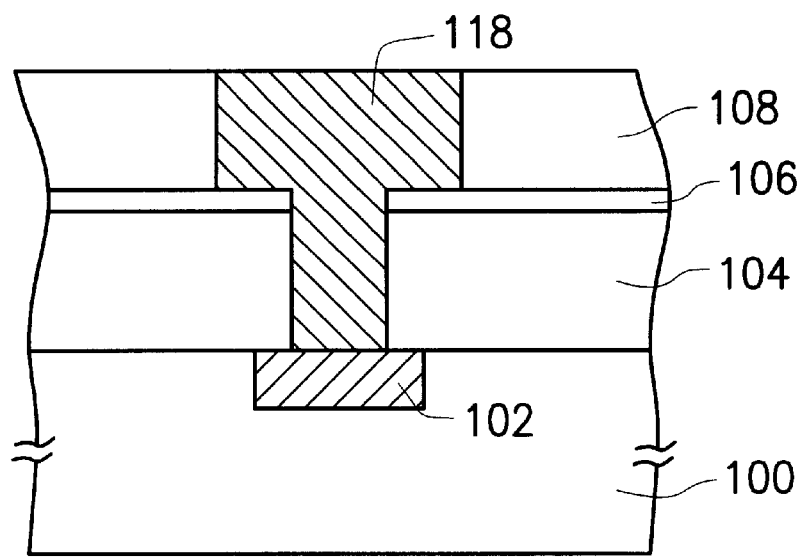

Reference will now be made in detail to the present preferred embodiments of the invention, examples of which are illustrated in the accompanying drawings. Wherever possible, the same reference numbers are used in the drawings and the description to refer to the same or like parts.

Figure 2A:
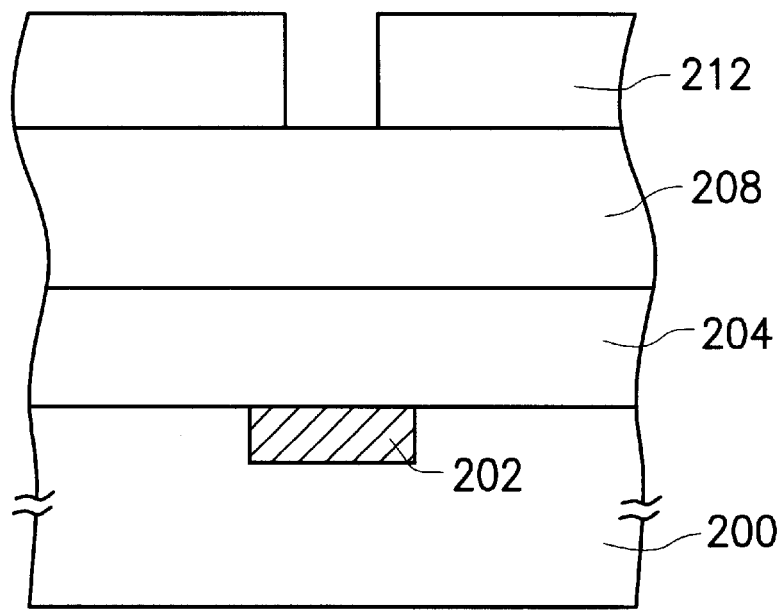
FIGS. 2A through 2F are schematic cross-sectional views showing the progression of steps for fabricating a dual damascene structure according to one preferred embodiment of this invention.

FIGS. 2A through 2F are schematic cross-sectional views showing the progression of steps for fabricating a dual damascene structure according to one preferred embodiment of this invention. As shown in FIG. 2A, a substrate 200 having a conductive layer 202 therein is provided. A dielectric layer 204 is formed over the substrate 200. The dielectric layer 204 is planarized to a thickness equal to the desired depth of a via. A dielectric layer 208 is formed over the dielectric layer 204. The dielectric layer 208 is planarized to a thickness equal to the desired depth of a metallic layer (a metallic line) in a dual damascene structure.

The dielectric layer 204 can be low dielectric constant spin on polymer (SOP) material such as organic materials FLARE™, SILK™, PARYLENE™, and PAE-II™. A photoresist layer is formed over the dielectric layer 208. Conventional photolithographic and etching techniques are employed to form a photoresist layer 212 having a via opening pattern therein. During the patterning step, a portion of the photoresist material will react with the dielectric layer 208 to form difficult-to-remove residues on the surface of the dielectric layer 208.

Figure 2B:
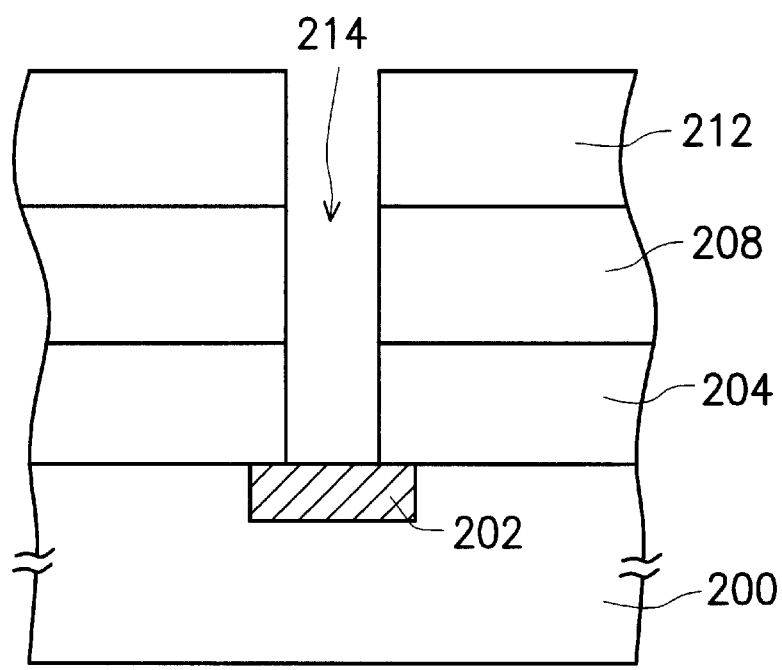

As shown in FIG. 2B, the dielectric layer 208 and the dielectric layer 204 are sequentially etched to form a via opening 214 using the photoresist layer 212 as an etching mask.

Figure 2C:
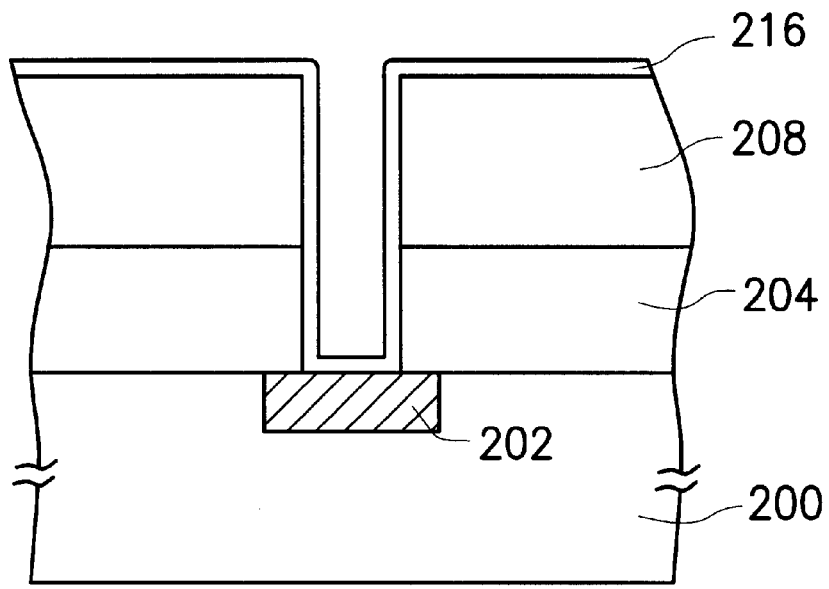

As shown in FIG. 2C, the photoresist layer 212 is removed. A conformal dielectric layer 216 is coated over the surface of the dielectric layer 210 and the interior surface of the via opening 214. The dielectric layer 216 functions as a liner dielectric layer. The dielectric layer 216 serves as a partition preventing any chemical reaction between subsequently deposited photoresist material and the dielectric layers 204 and 208 so that difficult-to-remove chemical residue is not produced, The dielectric layer 216 is preferably a silicon oxide layer formed, for example, by low-pressure chemical vapor deposition so that a dielectric layer conformal to the profile of the via opening 214 can easily form.

Figure 2D:
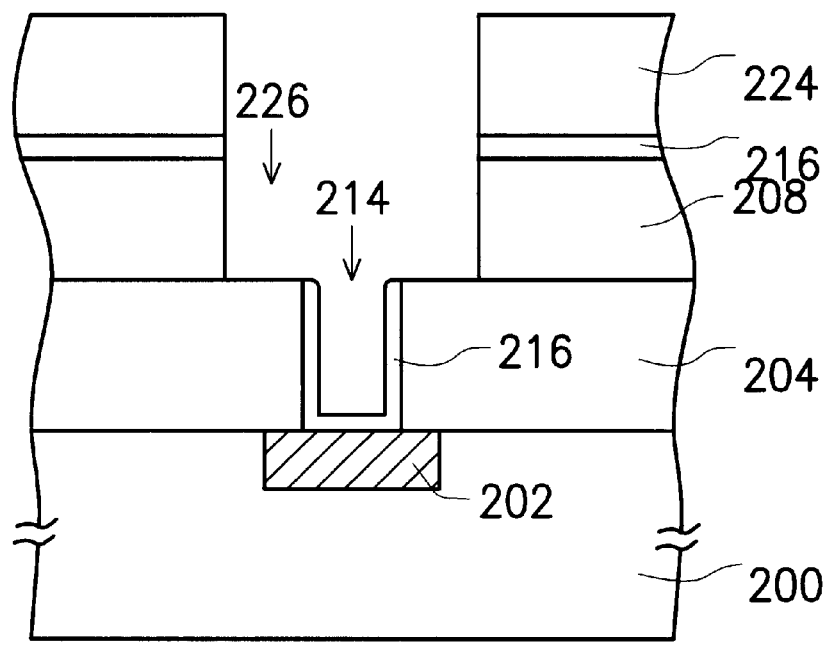

As shown in FIG. 2D, another photoresist layer is formed over the dielectric layer 216. Conventional photolithographic and etching techniques are used to pattern the photoresist layer into a photoresist layer 224 having a trench pattern for patterning the dielectric layer 208. In the patterning step, the dielectric layer 216 on the sidewalls 222 of the via opening 214 prevent any reaction between photoresist material and the dielectric layers 204 and 208. With the sidewalls 222 of the dielectric layers 204 and 208 protected by the liner dielectric layer 216, the desired via opening 214 profile can be preserved. Using the photoresist layer 224 as an etching mask and the dielectric layer 204 as an etching stop, a selective anisotropic dry etching operation is conducted. Ultimately, the dielectric layer 208 not covered by the photoresist layer 224 are removed to form a trench 226.

Figure 2E:
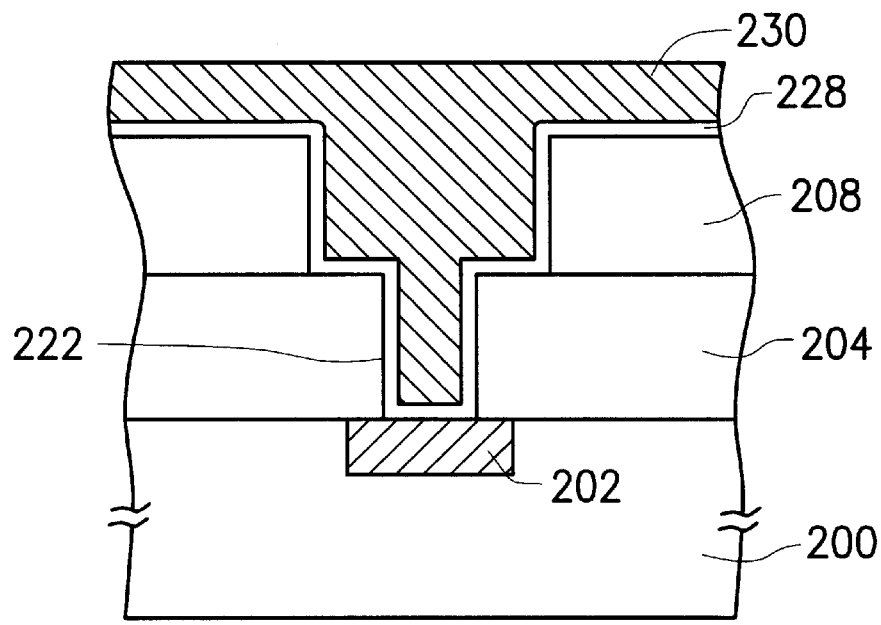
Figure 2F:
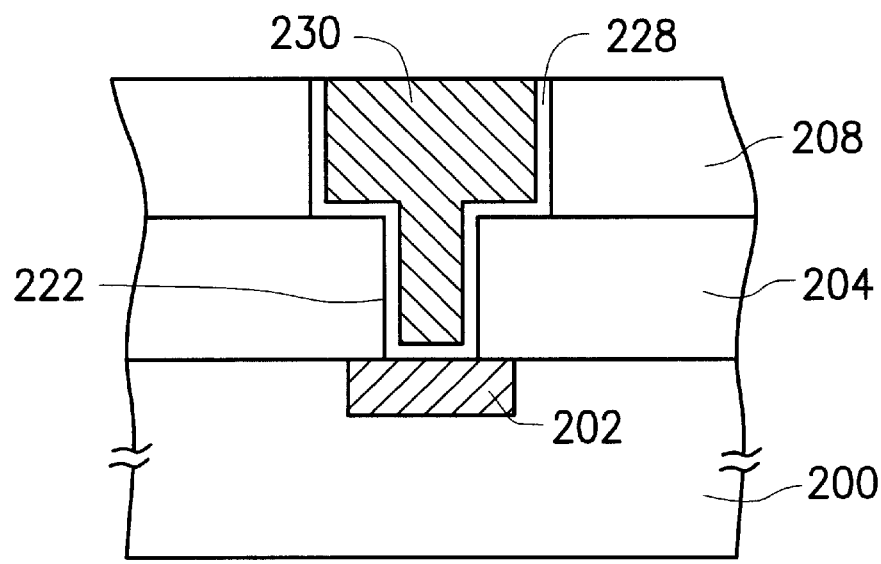

As shown in FIG. 2E, the photoresist layer 224 is removed. The liner dielectric layer 216 is next removed by wet etching. The wet etching operation is carried out using a solution containing buffered hydrofluoric acid. Conductive material is deposited over the substrate 200 to fill the via opening 214 and the trench 216, thereby forming a conductive layer 230. The conductive layer 230 can be a metallic layer such as a tungsten layer, an aluminum layer or a copper layer formed, for example, by chemical vapor deposition. Preferably, a conformal adhesive layer or barrier layer 228 is deposited over the substrate 200 before forming the conductive layer 230. This adhesive or barrier layer 228 not only increases the adhesion between the metallic layer and the dielectric layers 204 and 208, but also prevents the diffusion of metallic ions into the dielectric layers 204 and 208. Material forming the adhesive/barrier layer 228 includes titanium/titanium nitride, tantalum, tantalum nitride, tungsten nitride, titanium nitride and tantalum silicon nitride. After the conductive layer 230 is formed, a chemical-mechanical polishing operation is conducted to planarize the conductive layer 230 and remove excess conductive material and adhesive/barrier layer material above the dielectric layer 208. Ultimately, a dual damascene structure as shown in FIG. 2F is formed. If the conductive material is copper, a copper seeding layer 210 (not shown in the figure) needs to form on the surface of the dielectric layer 208, the via opening 214 and the trench 226 before the deposition of copper.

Since the surface of the dielectric layer 208 is not protected by any layer when the photoresist layer 212 is deposited, difficult-to-remove residues will form on the surface of the dielectric layer 208. Hence, a non-uniform copper seeding layer is normally formed on the interface with the dielectric layer 208. On the other hand, the sidewalls and bottom of both the via opening 214 and trench 226 are protected by the liner dielectric layer 216. Thus, an ideal profile is preserved and subsequent copper deposition is facilitated. However, any non-uniformity in the copper layer is finally removed by the planarization of the copper layer through chemical-mechanical polishing.

One major aspect of this invention is the formation of a conformal liner dielectric layer on the sidewalls of the via opening to prevent any chemical reaction between photoresist material and dielectric material to produce difficult-to-remove products. Hence, the desired via opening profile is formed.

In summary, one advantage of this invention includes the capacity to use low dielectric constant material to reduce parasitic capacitance and increase operating speed of devices suitable for forming highly integrated circuits. Another advantage of this invention is the capacity to preserve the trench and via opening profile of a dual damascene structure after photolithographic and etching steps.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a dual damascene structure, comprising the steps of:
   providing a substrate;
   forming a first low dielectric constant dielectric layer over the substrate;
   forming a second low dielectric constant dielectric layer over the first low dielectric constant dielectric layer;
   forming a first patterned photoresist layer above the substrate;
   removing a portion of the first dielectric layer and the second dielectric layer to form a via opening using the first patterned photoresist layer as a mask;
   removing the first patterned photoresist layer;
   forming a conformal third dielectric layer over the surface of the second dielectric layer and the interior surface of the via opening;
   forming a second patterned photoresist layer over the third dielectric layer;
   removing a portion of the second dielectric layer to form a trench using the second patterned photoresist layer as a mask;
   removing the second patterned photoresist layer;
   removing the third dielectric layer; and
   depositing conductive material into the via opening and the trench to form a conductive layer.

2. The method of claim 1, wherein material forming the first low dielectric constant dielectric layer and the second low dielectric constant dielectric layer includes a spin on polymer.

3. The method of claim 2, wherein the spin on polymer is selected from a group of organic materials that include FLARE™, SILK™, PARYLENE™, and PAE-II™.

4. The method of claim 1, wherein the step of forming the first and the second dielectric layer includes depositing a low dielectric constant compound in chemical vapor deposition.

5. The method of claim 1, wherein the first low dielectric constant dielectric layer and the second low dielectric constant dielectric layer are formed using different types of spin on polymers.

6. The method of claim 1, wherein the first low dielectric constant dielectric layer and the second low dielectric constant dielectric layer are formed by chemical vapor deposition using different types of low dielectric compounds.

7. The method of claim 1, wherein the step of forming the conformal third dielectric layer includes depositing silicon oxide in low-pressure chemical vapor deposition.

8. The method of claim 1, wherein the third dielectric layer is capable of prevention any chemical reaction between photoresist material and the first and the second dielectric layer thus avoiding hard-to-remove residues.

9. The method of claim 1, wherein the conformal third dielectric layer includes a silicon oxide liner layer.

10. The method of claim 1, wherein the step of removing the third dielectric layer includes wet etching.

11. The method of claim 1, wherein the step of removing the third dielectric layer includes wet etching using a solution containing buffered hydrofluoric acid.

12. The method of claim 1, wherein the conductive material includes tungsten, aluminum and copper.

13. A method of forming an opening in a low dielectric constant dielectric layer above a substrate, comprising the steps of:
   providing a substrate;
   sequentially forming a first low dielectric constant dielectric layer and a second low dielectric constant dielectric layer over the substrate;
   forming a first opening in the first and the second dielectric layer;
   forming a conformal third dielectric layer over the surface of the second dielectric layer and the interior surface of the opening;
   forming a patterned photoresist layer over the second dielectric layer;
   removing a portion of the second dielectric layer to form a second opening in the second dielectric layer using the patterned photoresist layer as a mask; and
   removing the patterned photoresist layer.

14. The method of claim 13, wherein the step of forming the conformal third dielectric layer includes low-pressure chemical vapor deposition.

15. The method of claim 13, wherein material forming the third dielectric layer is capable of preventing any chemical reaction between photoresist material and the first and the second layer thus avoiding difficult-to-remove residues.

* * * * *